United States Patent
Koike et al.

(10) Patent No.: US 8,709,939 B2
(45) Date of Patent: Apr. 29, 2014

(54) SEMICONDUCTOR DEVICE HAVING A MULTILEVEL INTERCONNECT STRUCTURE AND METHOD FOR FABRICATING THE SAME

(71) Applicants: Semiconductor Technology Academic Research Center, Kanagawa (JP); National University Corporation Tohoku University, Miyagi (JP)

(72) Inventors: Junichi Koike, Sendai (JP); Yoshito Fujii, Sendai (JP); Jun Iijima, Sendai (JP); Noriyoshi Shimizu, Kawasaki (JP); Kazuyoshi Maekawa, Itami (JP); Koji Arita, Kanagawa (JP); Ryotaro Yagi, Hamamatsu (JP); Masaki Yoshimaru, Hachioji (JP)

(73) Assignees: Semiconductor Technology Academic Research Center, Kanagawa (JP); National University Corporation Tohoku University, Miyagi (JP)

( * ) Notice: Subject to any disclaimer, the term of this patent is extended or adjusted under 35 U.S.C. 154(b) by 0 days.

(21) Appl. No.: 13/633,562

(22) Filed: Oct. 2, 2012

(65) Prior Publication Data
US 2013/0089979 A1 Apr. 11, 2013

Related U.S. Application Data

(62) Division of application No. 12/382,624, filed on Mar. 19, 2009, now Pat. No. 8,304,908.

(30) Foreign Application Priority Data

Mar. 19, 2008 (JP) .................................. 2008-071835

(51) Int. Cl.
*H01L 21/4763* (2006.01)

(52) U.S. Cl.
USPC ........... 438/628; 438/618; 438/622; 438/625; 438/626; 438/627; 438/629

(58) Field of Classification Search
USPC .................................. 438/618, 622, 625–629
See application file for complete search history.

(56) References Cited

U.S. PATENT DOCUMENTS

| 5,990,416 A | 11/1999 | Windisch et al. |
| 6,057,223 A | 5/2000 | Lanford et al. |

(Continued)

FOREIGN PATENT DOCUMENTS

| JP | 9-213695 | 8/1997 |
| JP | 10-18045 | 1/1998 |

(Continued)

OTHER PUBLICATIONS

Japanese Office Action mailed Feb. 16, 2010 in corresponding Japanese Patent Application 2008-071835.

(Continued)

*Primary Examiner* — Bac Au

(57) ABSTRACT

A multilevel interconnect structure in a semiconductor device and methods for fabricating the same are described. The multilevel interconnect structure in the semiconductor device includes a first insulating layer formed on a semiconductor wafer, a Cu interconnect layer formed on the first insulating layer, a second insulating layer formed on the Cu interconnect layer, and a metal oxide layer formed at an interface between the Cu interconnect layer and the second insulating layer. The metal oxide layer is formed by immersion-plating a metal, such as Sn or Zn, on the Cu interconnect layer and then heat-treating the plated layer in an oxidizing atmosphere.

11 Claims, 9 Drawing Sheets

(56) References Cited

U.S. PATENT DOCUMENTS

| | | | |
|---|---|---|---|
| 6,114,188 A | 9/2000 | Oliver et al. | |
| 6,147,000 A | 11/2000 | You et al. | |
| 6,154,349 A | 11/2000 | Kanai et al. | |
| 6,160,315 A | 12/2000 | Chiang et al. | |
| 6,500,749 B1 | 12/2002 | Liu et al. | |
| 6,638,795 B2* | 10/2003 | Ikeda et al. | 438/132 |
| 6,674,170 B1* | 1/2004 | Ngo et al. | 257/774 |
| 6,900,119 B2 | 5/2005 | Hu | |
| 6,943,451 B2* | 9/2005 | Whitehair et al. | 257/774 |
| 6,989,601 B1 | 1/2006 | Van Ngo et al. | |
| 7,115,996 B2* | 10/2006 | Edelstein et al. | 257/762 |
| 7,176,505 B2 | 2/2007 | Rueckes et al. | |
| 7,220,674 B2 | 5/2007 | Marieb | |
| 7,241,677 B2 | 7/2007 | Soininen et al. | |
| 7,247,946 B2 | 7/2007 | Bruley et al. | |
| 7,282,835 B2 | 10/2007 | Kawakami | |
| 7,394,157 B2 | 7/2008 | Farrar | |
| 7,829,875 B2 | 11/2010 | Scheuerlein | |
| 7,856,710 B2 | 12/2010 | Kariya et al. | |
| 7,892,956 B2 | 2/2011 | Deligianni et al. | |
| 7,902,063 B2 | 3/2011 | Chiang et al. | |
| 7,929,257 B2 | 4/2011 | Machita et al. | |
| 8,085,512 B2 | 12/2011 | Mizuno et al. | |
| 2002/0027261 A1* | 3/2002 | Besser et al. | 257/584 |
| 2002/0036309 A1 | 3/2002 | Sekiguchi et al. | |
| 2003/0124255 A1* | 7/2003 | Ueno et al. | 427/304 |
| 2006/0030143 A1* | 2/2006 | Ivanov | 438/622 |
| 2006/0131751 A1 | 6/2006 | Minamihaba et al. | |
| 2006/0157854 A1* | 7/2006 | Takewaki et al. | 257/758 |
| 2006/0258150 A1 | 11/2006 | Raaijmakers et al. | |
| 2007/0123043 A1* | 5/2007 | Streck et al. | 438/687 |
| 2007/0269978 A1* | 11/2007 | Shih et al. | 438/643 |
| 2008/0054464 A1 | 3/2008 | Ikeda et al. | |

FOREIGN PATENT DOCUMENTS

| | | |
|---|---|---|
| JP | 10-229084 | 8/1998 |
| JP | 2003-82499 | 3/2003 |
| JP | 2003-342735 | 12/2003 |
| JP | 2005271515 | 10/2005 |
| JP | 2006-179599 | 7/2006 |
| JP | 2006-203197 | 8/2006 |
| JP | 2006-31269 | 11/2006 |

OTHER PUBLICATIONS

C.-K. Hu et al, "Reduced Cu interface diffusion by CoWP surface coating", Microelectronic Engineering 70(2003), 406-411.

S.Chhun et al., "Influence of $SiH_4$ process step on physical and electrical properties of advanced copper interconnects", Microelectronic Engineering 76(2004) 106-112.

F. Decarli and N. Collari, "Studio termoponderale delle ossidazioni metalliche", la mettalrgia italitana 44 (1952) 178.

Japanese Decision to Decline Amendment mailed Mar. 29, 2011 in corresponding Japanese Patent Application 2008-071835.

Japanese Decision on Final Rejection mailed Mar. 29, 2011 in corresponding Japanese Patent Application 2008-071835.

Restriction Requirement issued in U.S. Appl. No. 12/382,624 dated Dec. 8, 2010.

Office Action issued in U.S. Appl. No. 12/382,624 dated Feb. 1, 2011.

Office Action issued in U.S. Appl. No. 12/382,624 dated Oct. 11, 2011.

Office Action issued in U.S. Appl. No. 12/382,624 dated Jan. 19, 2012.

Office Action issued in U.S. Appl. No. 12/382,624 dated Mar. 2, 2012.

Notice of Allowance issued in U.S. Appl. No. 12/382,624 dated Jul. 2, 2012.

U.S. Appl. No. 12/382,624, filed Mar. 19, 2009, Junichi Koike et al., Semiconductor Technology Academic Research Center and National University Corporation Tohoku University.

* cited by examiner

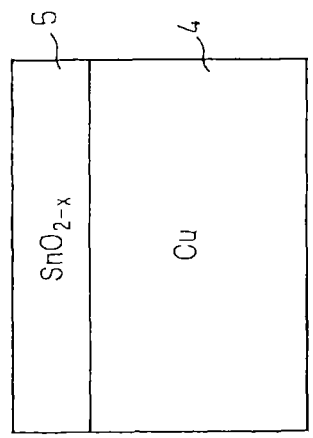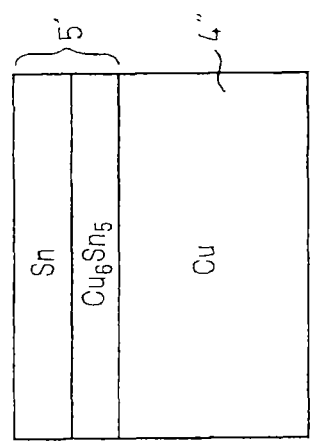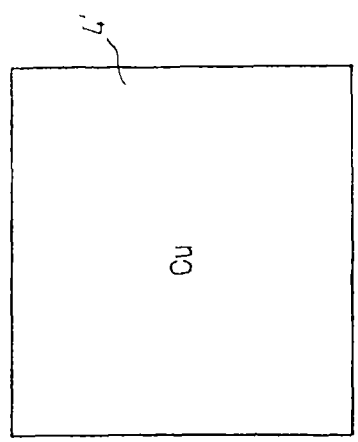

SEMICONDUCTOR DEVICE HAVING A MULTILEVEL INTERCONNECT STRUCTURE AND METHOD FOR FABRICATING THE SAME

CROSS-REFERENCE TO RELATED APPLICATION

This application is a divisional and claims priority to U.S. application Ser. No. 12/382,624, filed Mar. 19, 2009, which is based upon and claims the benefit of priority of the prior Japanese Patent Application No. 2008-071835, filed on Mar. 19, 2008, the entire contents of which are incorporated herein by reference.

FIELD

The present invention relates to a semiconductor device and a method for fabricating the same, and more particularly to a Cu multilevel interconnect structure that can improve interconnect reliability and performance, and a method for fabricating such a structure.

BACKGROUND

Multilevel interconnects in semiconductor integrated circuits are formed principally from Cu interconnect lines and insulating layers. The Cu interconnect lines embedded in the insulating layers are covered on their sides and bottoms by barrier layers of Ta/TaN or the like, i.e., Cu diffusion prevention films, and their top surfaces are covered by cap layers of SiN, SiCN, or the like. The purpose of forming such cap layers is to prevent oxidation of the Cu interconnect surfaces when forming an insulating layer thereon and to prevent Cu diffusion between adjacent Cu interconnects after forming the insulating layer.

However, since the adhesion between the Cu interconnect surface and the cap layer formed thereon is poor, and the interface may thus serve as a diffusion path for Cu atoms, causing electromigration failure or time-dependent dielectric breakdown (TDDB), the present state of the art of cap layer material has a problem from the standpoint of reliability. It is therefore necessary to provide a cap layer material having good adhesion and barrier characteristics, as well as good oxidation resistance and a process for fabricating the same.

In the present state of the art, the cap layer is formed over the entire surface of each layer, i.e., not only on the Cu interconnects but also on the insulating layer. The dielectric constant of such cap layers is 3 to 7, and because of the presence of the cap layer over the entire layer interface, the dielectric constant of the insulating layer tends to increase, contrary to the requirement that the dielectric constant be reduced; therefore, forming the cap layer over the entire surface is not desirable in view of interconnect delays in logic circuits or memory circuits. Accordingly, it is desirable to provide a cap layer material that can exhibit the desired characteristics when the cap layer is formed only on the interconnect surface, not over the entire layer interface, and a process for fabricating the same.

The presence of the cap layer over the entire layer interface is also not desirable when applications to CMOS image sensors are considered. In image sensor applications, the cap layer which, in the present state of the art, is formed over the entire layer interface has the problem that the amount of light that reaches the sensor area decreases because of the high visible light reflectivity of the insulating layer. Accordingly, it is desirable to provide a cap layer material such that the cap layer can be formed only on the interconnect surface without leaving any highly reflective material in the insulating layer, and a process for fabricating the same.

Various attempts have been made to solve the above problems. For example, Non-patent Document 1 reports that when the cap layer is formed by immersion-plating the Cu surface with CoWP, the adhesion of the interface improves, and the electromigration lifetime increases. However, since this process usually requires that the plating be applied at temperatures of 70° C. or higher, it is extremely difficult to manage the plating solution, and the reproducibility of the manufacturing process is difficult to achieve. Furthermore, since CoWP does not have oxidation resistance, CoWP only serves to improve the adhesion, and a conventional cap layer of SiCN or the like has to be formed over the entire interface in an additional process in order to provide the necessary oxidation resistance. Further, if impurities exist on the surface of the insulating layer, CoWP is also deposited on them, causing problems such as leakage between interconnects and degradation of TDDB characteristics, and these problems become more serious as the pattern feature size decreases by reducing the spacing between interconnects.

Non-patent Document 2 reports that when a CuSiN layer is formed on the Cu surface by the reaction of $SiH_4$ and $NH_3$, the EM lifetime improves. However, when forming a Cu—Si solid solution on the Cu surface by using $SiH_4$, if the Si content is too high, Si residues will remain in Cu even after nitriding Si with $NH_3$ in the subsequent step, and this can cause an increase in resistance. Furthermore, since CuSiN itself does not have oxidation resistance, a conventional cap layer of SiCN or the like has to be formed over the entire interface in order to provide the necessary oxidation resistance.

Patent Document 1 proposes a technique that improves the reliability of interconnects by using a metal such as Sb, In, Sn, Hf, Ti, or the like for forming a cap layer in a multilevel interconnect structure comprising interconnects formed of Cu or a Cu alloy and insulating layers formed of dielectric material. According to the technique proposed in this document, the metal for forming the cap layer is deposited on the exposed surfaces of the Cu interconnect and the insulating layer, and the cap layer metal on the surface of the insulating layer is oxidized when deposited thereon, while the cap layer metal deposited on the surface of the Cu interconnect is diffused into the Cu interconnect to form a solid solution or an intermetallic compound. It is claimed that the solid-solutioned cap layer metal is segregated along grain boundaries in the Cu interconnect or at the interface between the Cu interconnect and the upper dielectric material, slowing the diffusion rate of Cu and thus serving to reduce electromigration or stress migration related failures.

It is also claimed that metals such as Al and Ti when deposited on the Cu interconnect surface form oxides by just being exposed to air, and that these oxides cannot improve the reliability of the interconnects. Accordingly, it is claimed that rather than forming oxide on the Cu interconnect surface, it is preferable to allow the cap layer metal to form a solid solution. Furthermore, since the resistance of the Cu interconnect increases when the cap layer metal is solid-solutioned into pure Cu, the thickness of the metal cap layer is held within a range of 0.5 nm to 5.0 nm, thereby holding the solid solution at a low concentration to suppress the increase of the resistance.

However, such a low-concentration solid solution does not provide the necessary oxidation resistance when the interconnect is exposed to an oxidizing atmosphere, and therefore has the shortcoming that the Cu interconnect is internally oxidized during the process of forming the upper insulating layer on the Cu interconnect. There is the further problem that after the insulating layer is formed, diffusion occurs between the Cu interconnect and the upper insulating layer in a subsequent high-temperature process. Furthermore, with the oxide of the cap metal formed on the surface of the insulating layer, it is difficult to obtain good characteristics as an insulating film, and it is therefore extremely difficult to ensure good interconnect leakage current and TDDB characteristics; accordingly, the proposed technique is not a realistic one. Further, since the layers formed here are high dielectric constant layers, the dielectric constant of the insulating layer as a whole increases, resulting in the problem that the interconnect propagation delay increases.

Though not directly related to the above-described semiconductor interconnects, it is generally known that the internal oxidation of Cu can be suppressed by coating the Cu surface with Sn, but no such known techniques are concerned with oxidizing the Sn-plated layer for use. For example, in Patent Document 2, a material having excellent oxidation resistance is fabricated by plating the inside of a copper pipe with Sn. Since preferential oxidation occurs when pin holes are formed in the Sn plating, a 1 µm thick Sn-plated layer free from pin holes is formed by controlling the concentration of each component in the plating solution.

On the other hand, in Patent Document 3, a layer of Ni or Cu or an alloy thereof is plated as an intermediate layer onto the surface of a copper base, and Sn plating is applied on top of that, thereby forming a plated layer with an Sn—Cu intermetallic compound dispersed therein. This uppermost layer is formed to a thickness of 0.5 µm or greater to provide the necessary oxidation resistance. Further, in Patent Document 4, an intermetallic compound diffusion layer containing Cu and Sn is formed to a thickness smaller than 0.2 µm by Sn immersion plating and, on top of that, a layer of benzotriazole or a derivative thereof is formed as a corrosion inhibitor layer to provide the necessary oxidation resistance.

In this way, in the prior art Sn plating on a bulk material, pure Sn or an Sn—Cu intermetallic compound is formed, but in order to provide the necessary oxidation resistance, the layer thickness has to be reduced to a micron-order thickness, and when the thickness is reduced, an intermediate layer or a surface layer has to be additionally formed.

[Patent Document 1] Japanese Unexamined Patent Publication No. 2006-203197
[Patent Document 2] Japanese Unexamined Patent Publication No. H10-18045
[Patent Document 3] Japanese Unexamined Patent Publication No. 2003-82499
[Patent Document 4] Japanese Unexamined Patent Publication No. 2006-319269
[Non-patent Document 1] C. K. Hu et al., Microelec. Eng., 70, 406 (2003)
[Non-patent Document 2] S. Chhun et al., Microelec. Eng., 76, 106 (2004)
[Non-patent Document 3] F. DeCarli and N. Collari, Metallurg. ital. 44 (1952) 178

As described above, in the fabrication of Cu multilevel interconnects for semiconductor integrated circuits, attempts have been made to form a cap layer only at the interface between the Cu interconnect and the upper insulating layer by forming a CoWP layer or a CuSiN layer, but these layers have neither oxidation resistance nor barrier properties, and the use of such layers only serves to improve the adhesion of the interface between the conventional SiN, SiCN, or SiC cap layer and the underlying Cu interconnect; accordingly, the conventional cap layer has to be formed over the entire layer interface. This has been a major obstacle to reducing the dielectric constant of the insulating layer. Further, the method has been proposed that diffuses a metal, such as Sb, In, Sn, Hf, Ti, or the like, into the Cu interconnect to form a solid solution or an intermetallic compound therein, while on the other hand, forming oxides of such metals on the surface of the insulating layer, but this method not only has the problem that the Cu interconnect resistance increases, but also has the problems that the oxidation of the Cu surface cannot be prevented and that the dielectric constant of the insulating layer increases.

In view of the above enumerated problems, a first challenge of the present invention is to form a novel interface layer at the interface between the insulating layer and the underlying Cu interconnect and to confer excellent adhesion, oxidation resistance, and diffusion barrier characteristics to this novel layer. A second challenge is to hold the dielectric constant of the insulating layer as a whole to a low value compared with the prior art structure by forming the novel interface layer only on the Cu interconnect. A third challenge is to prevent the resistance of the Cu interconnect from significantly increasing after forming the novel interface layer, compared with that of the prior art Cu interconnect. It is an object of the present invention to provide a novel interface layer and a process for fabricating the same that address the above challenges.

To address the above challenges, there is provided a semiconductor device having a multilevel interconnect structure comprising: a first insulating layer formed on a semiconductor wafer; a Cu interconnect layer formed on a surface of the first insulating layer; a second insulating layer formed on the Cu interconnect layer; and a metal oxide layer formed at an interface between the Cu interconnect layer and the second insulating layer.

In the above structure, the metal oxide layer may be an Sn oxide or Zn oxide layer. Further, the metal oxide layer may be formed by first depositing a metal layer selectively on the Cu interconnect layer by immersion plating, and then heat-treating the metal layer in an oxygen-containing atmosphere.

In the above structure, the metal oxide layer may be formed to a thickness not smaller than 5 nm but not greater than 50 nm. Further, the Cu interconnect layer may be formed so that the concentration of metal atoms forming the metal oxide layer and diffused into the Cu interconnect layer to form a solid solution therein does not exceed 2% by atomic fraction.

The Cu interconnect layer may be formed in an interconnect trench formed within the first insulating layer, and the metal oxide layer may be formed selectively on the Cu interconnect layer.

The metal oxide layer may be formed by first applying chemical-mechanical polishing to the surface of the Cu interconnect layer, then depositing a metal layer selectively on the Cu interconnect layer by immersion plating, and thereafter heat-treating the metal layer in an oxygen-containing atmosphere.

To address the above challenges, there is provided a method for fabricating a semiconductor device having a multilevel interconnect structure, comprising the steps of: forming a first insulating layer on a semiconductor wafer; forming a Cu interconnect layer on a surface of the first insulating layer; depositing a metal layer on the Cu interconnect layer by immersion plating; forming a metal oxide layer by heat-treating the metal layer in an oxygen-containing atmosphere; and forming a second insulating layer on the metal oxide layer.

The step of oxidizing the metal layer may include the step of heat-treating the semiconductor wafer, including the metal layer, in the oxygen-containing atmosphere for a period not shorter than 30 seconds but not longer than 60 minutes at a temperature not lower than 150° C. but not higher than 450° C.

To address the above challenges, there is provided a method for fabricating a semiconductor device having a multilevel interconnect structure, comprising the steps of: forming a first insulating layer on a semiconductor wafer; forming an interconnect trench in the first insulating layer; embedding a Cu layer into the interconnect trench; cleaning the surface of the Cu layer by chemical-mechanical polishing; depositing a metal layer on the cleaned surface of the Cu layer by immersion plating; forming a metal oxide layer by heat-treating the metal layer in an oxygen-containing atmosphere; and forming a second insulating layer on top of the first insulating layer containing the metal oxide layer.

In the above method, the step of coating an interior surface of the interconnect trench with a film that acts as a barrier layer may be included between the step of forming the interconnect trench and the step of embedding the Cu layer. Further, the step of forming the metal oxide layer may include the step of heat-treating the semiconductor wafer, including the metal layer, in the oxygen-containing atmosphere for a period not shorter than 30 seconds but not longer than 60 minutes at a temperature not lower than 150° C. but not higher than 450° C.

Further, if copper oxide particles are precipitated on the surface of the metal oxide layer in the heat treating step, the copper oxide particles may be removed before proceeding to the step of forming the second insulating film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A to 2C are diagrams showing fabrication steps for a Cu interconnect layer and a cap layer;

DESCRIPTION OF EMBODIMENTS

Figure 1:
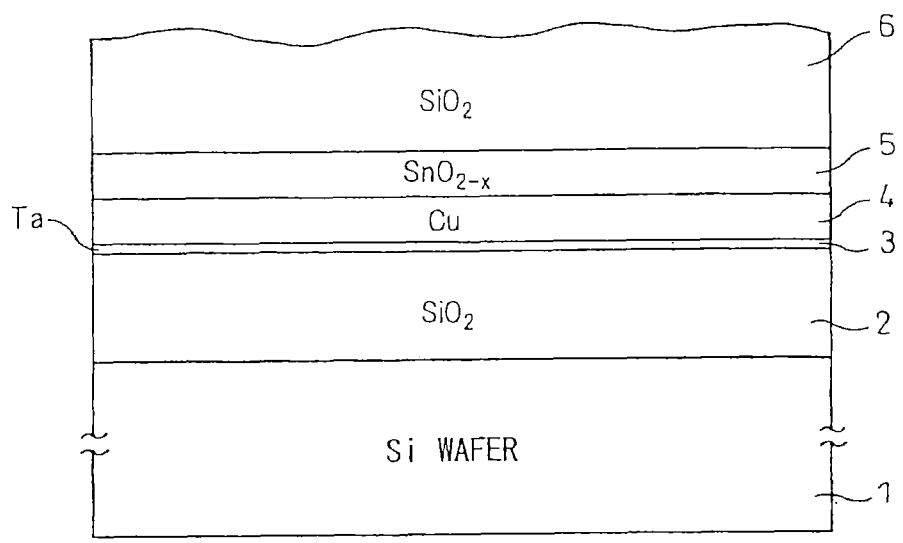
FIG. 1 is schematic cross-sectional view showing a multilevel interconnect structure for a semiconductor integrated circuit according to a first embodiment.

Various embodiments of the present invention will be described below with reference to the drawings. Throughout the drawings, the same reference numerals designate the same or similar portions, and the description of such portions, once given, will not be repeated thereafter. In each embodiment shown herein, Sn oxide is shown as being the oxide formed on the Cu interconnect layer surface, but it will be appreciated that even when Zn oxide is used, the present invention can be implemented using a similar structure and similar fabrication process.

[Embodiment 1]

FIG. 1 is schematic cross-sectional view showing a multilevel interconnect structure for a semiconductor integrated circuit according to a first embodiment. In FIG. 1, only a single Cu interconnect layer 4 is shown which is formed between first and second interlayer insulating films 2 and 6, but it will be appreciated that a multilevel interconnect structure can be constructed by forming a second Cu interconnect layer, etc., in a similar process on top of the second interlayer insulating film 6 which, in that case, serves as the lower insulating film. The insulating layers here are shown as being formed from $SiO_2$, but use may be made of any other material suitable for use in a multilevel interconnect structure for a semiconductor integrated circuit; for example, inorganic insulating layers of SiOCH, etc. carrying a methyl group or organic insulating film of polyarylene, etc., are also possible.

In FIG. 1, reference numeral 1 is a Si wafer, 2 is the first $SiO_2$ layer, 3 is a Ta thin film, 4 is the Cu interconnect layer, 5 is an Sn oxide layer which acts as a cap layer for the Cu interconnect layer 4, and 6 is the second $SiO_2$ layer. Various device structures for forming a desired semiconductor integrated circuit are fabricated within the Si wafer 1 by using known techniques. The first $SiO_2$ layer 2 is formed on the Si wafer 1 by plasma CVD, and acts as the lower insulating film for the Cu interconnect layer 4. The Ta thin film 3 which acts as a diffusion barrier layer is formed on the $SiO_2$ layer 2 by DC sputtering, and serves to prevent the oxygen contained in the lower insulating film 2 from diffusing into the Cu interconnect layer 4 and oxidizing it when forming the Cu interconnect layer 4 in the subsequent step.

FIGS. 2A to 2C are diagrams for explaining the structure of the Cu interconnect layer 4 and the Sn oxide layer as the cap layer by referring to their fabrication steps. First, as shown in FIG. 2A, a Cu thin film 4' was formed to a thickness of 160 nm on the Ta thin film 3 (see FIG. 1). Next, as shown in FIG. 2B, an Sn-plated layer 5' was formed by depositing Sn on the thus formed sample by immersion plating at room temperature. The plating solution used was composed of 40 grams of stannous sulfate per liter, 100 grams of sulfuric acid per liter, 30 grams of cresol sulfonic acid per liter, and 10 grams of surfactant per liter, and the film was deposited at room temperature.

Figure 3:
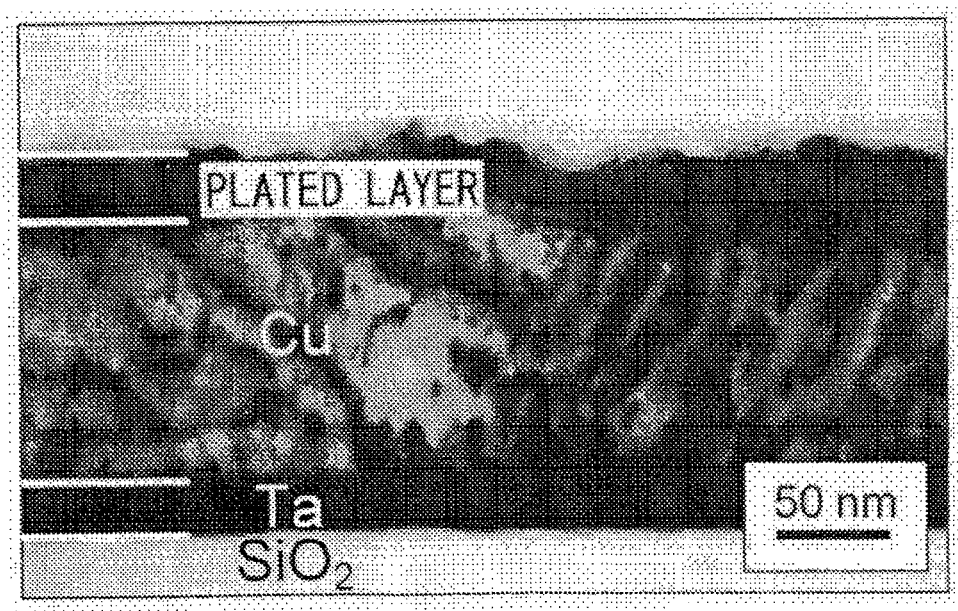
FIG. 3 is a TEM photograph showing a cross section after Sn plating.

FIG. 3 is a transmission electron micrograph showing the cross section of the sample after forming the Sn-plated layer 5'. The thickness of the Cu film 4" (see FIG. 2B), which was 160 nm before the plating, decreased to 108 nm after the plating, and the thickness of the Sn-plated layer 5' formed on the Cu surface was 35 nm. This shows that the Cu corresponding to the thickness of 52 nm was eluted by the electroless plating and replaced by the 35-nm thick Sn-plated layer 5'. When the composition was analyzed using energy dispersive X-ray spectroscopy (EDS), it was found that the 35-nm thick Sn-plated layer 5' was an Sn-rich Sn—Cu alloy containing Cu, and the presence of an intermetallic compound having the composition $Cu_6Sn_5$ was also observed at some sites.

Next, the sample was heat-treated for 30 minutes at 180° C. in two different kinds of oxidizing atmospheres, respectively. The first atmosphere was Ar+10 ppm $O_2$, and the second atmosphere was air. After the oxidizing heat treatment, the phases existing in the sample were identified using X-ray diffraction to observe the change before and after the heat treatment. The phases existing immediately after the plating were Cu, Sn, and $Cu_6Sn_5$, as shown in FIG. 2B. The phases existing in the sample heat-treated in the atmosphere of Ar+10 ppm $O_2$ were Cu and $SnO_{2-x}$ (x=0 to 0.5), as shown in FIG. 2C. The phases existing in the sample heat-treated in the air atmosphere were also Cu and $SnO_{2-x}$. If Sn or oxygen is solid solutioned into the Cu, a change in the position of the Cu diffraction peak should be observed by X-ray diffraction, but no such changes were observed.

Though not directly related to the fabrication process of the multilevel interconnect structure, to verify the effect of the $SnO_{2-x}$ layer 6 the heat-treated sample was further subjected to high-temperature heat treatment in an air atmosphere for five minutes at 300° C., and the oxidation resistance and diffusion barrier characteristics that the $SnO_{2-x}$ layer 6 had with respect to the Cu layer 4 were checked. As a result, the position of the Cu diffraction peak was that of Cu, and no appreciable change in the peak intensity was observed, nor any solid solutioning of Sn in the Cu or oxidation of the Cu. Further, when a tape test was conducted to check the adhesion between the Sn oxide coating and the Cu thin film, no delamination occurred not only immediately after the plating, but also after the oxidizing heat treatment or after the high-temperature heat treatment in the air, and it was thus found that good adhesion was achieved.

In this way, with the $SnO_{2-x}$ layer 5, an interconnect structure was achieved that exhibited good oxidation resistance and good barrier and adhesion characteristics under the heat treatment conditions used in a standard semiconductor process. Accordingly, as shown in FIG. 1, the upper insulating layer 6 can be formed directly on the Sn oxide cap layer 5 to prepare for the fabrication of the next interconnect layer.

Though not shown here, the second Cu interconnect layer is fabricated on top of the insulating layer 6 in the same manner as the first Cu interconnect layer. The first and second interconnect layers are connected as needed, for example, by means of via holes, but such techniques are well known in the part and will not be described here.

It should also be noted that when the second insulating film 6 was formed from TEOS—$SiO_2$, the underlying Cu layer 4 was not oxidized, and it was thus verified that the $SnO_{2-x}$ layer 5 had oxidation resistance sufficient to protect the Cu layer 4.

[Embodiment 2]

Figure 4A:
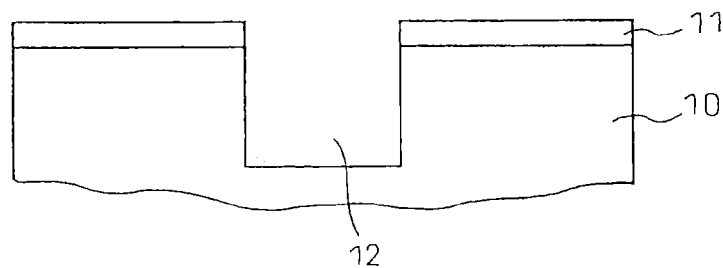
FIGS. 4A to 4C are diagrams showing a method for fabricating a multilevel interconnect structure for a semiconductor integrated circuit according to a second embodiment.

FIGS. 4A to 4C and 5A to 5C are diagrams showing a method for fabricating a multilevel interconnect structure for a semiconductor integrated circuit according to a second embodiment. In this embodiment, the Cu multilevel interconnect structure is fabricated using a damascene process. Further, as shown in FIG. 4A, a cap layer 11 which is formed, for example, of a silicon nitride film, and which also acts as a hard mask, is deposited over a TEOS—$SiO_2$ insulating layer 10, except the portion thereof where an interconnect trench 12 is to be formed, and the interconnect trench 12 having a width of 150 nm is formed by etching. A Si wafer containing various diffusion regions for forming logic circuits, memory circuits, etc., underlies the $SiO_2$ layer 10, but is not shown here.

Figure 4B:
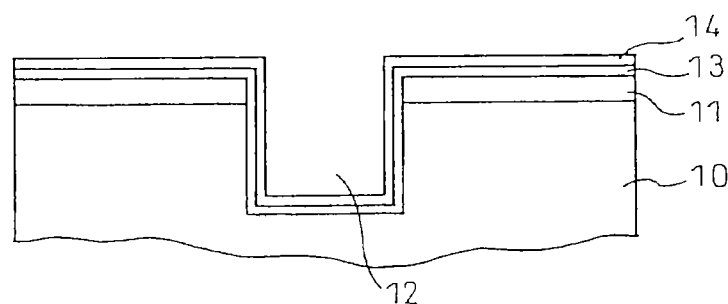
Figure 4C:
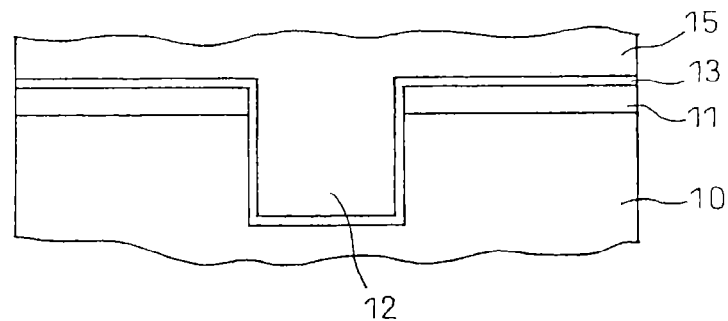

Next, as shown in FIG. 4B, a Ta/TaN diffusion barrier layer 13 is formed, for example, by DC sputtering, and Cu is sputtered on top of that to form a seed layer 14 for electrolytic plating. Then, as shown in FIG. 4C, Cu is electrolytically plated to form a Cu interconnect layer 15 by embedding the Cu into the interconnect trench 12.

Figure 5A:
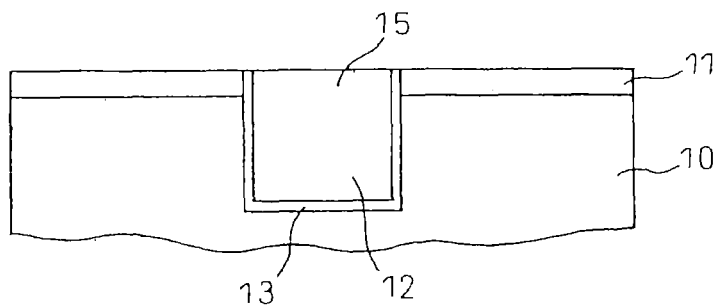
FIGS. 5A to 5C are diagrams showing the method for fabricating the multilevel interconnect structure for the semiconductor integrated circuit according to the second embodiment, in particular, the steps that follow the steps shown in FIG. 4.
Figure 5B:
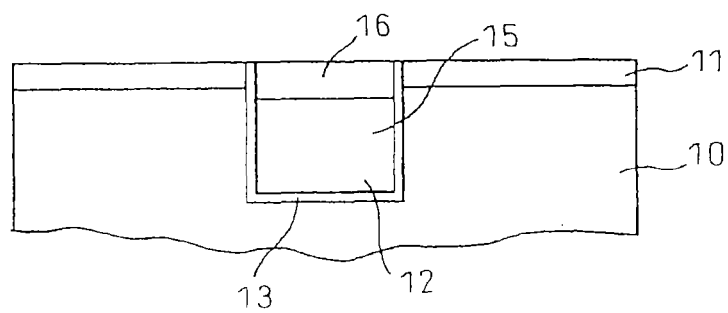

After that, as shown in FIG. 5A, by applying chemical-mechanical polishing (CMP) to the upper surface of the interconnect layer 15, the Cu-plated layer and the barrier layer 13 are removed everywhere except the portion where the interconnect trench 12 is formed, and the surface of the interconnect layer 15 is cleaned. Thereafter, as shown in FIG. 5B, an Sn-plated layer 16 is deposited selectively on the surface of the interconnect layer 15 by Sn immersion plating. The immersion plating conditions used here are: 40 grams of stannous sulfate per liter, 100 grams of sulfuric acid per liter, 30 grams of cresol sulfonic acid per liter, and 10 grams of surfactant per liter. The film is then deposited at room temperature.

Figure 7:
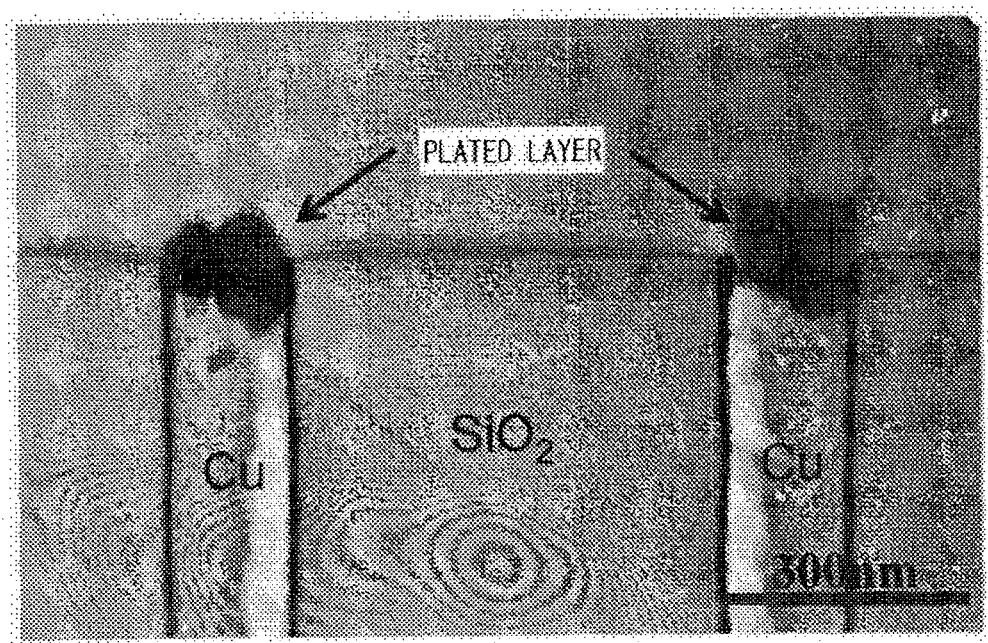
FIG. 7 is a cross-sectional TEM image of an Sn immersion-plated layer formed on the Cu interconnect embedded in an interconnect trench of linewidth 150 nm.

FIG. 7 shows a cross-sectional TEM (transmission electron micrograph) image of the Sn immersion-plated layer 16 (see FIG. 5B) formed on the Cu interconnect embedded in the interconnect trench of linewidth 150 nm. As can be seen from the image, the Sn-plated layer 16 is deposited selectively on the Cu interconnect layer 15, and not deposited on the insulating layer 10, thus achieving excellent selective deposition characteristics.

Figure 5C:
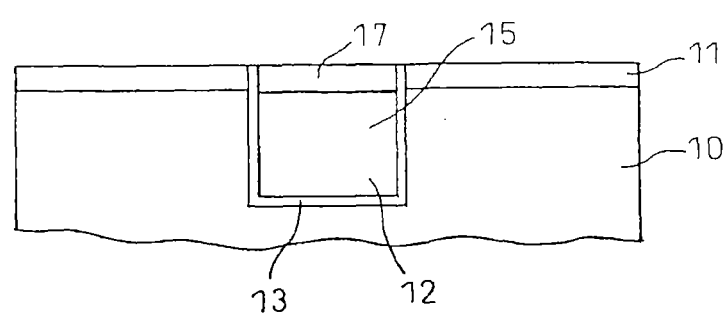

After forming the Sn-plated layer 16 selectively on the Cu interconnect layer 15, the resulting sample is heat-treated in an air atmosphere for 30 minutes at 180° C., forming an $SnO_{2-x}$ cap layer 17 by selectively oxidizing Sn on the Cu surface, as shown in FIG. 5C. The heat treatment may be performed in an oxidizing atmosphere of Ar+10 ppm $O_2$. As earlier described in the first embodiment, the $SnO_{2-x}$ cap layer 17 acts as an effective cap layer for the Cu interconnect layer 15.

Figure 6A:
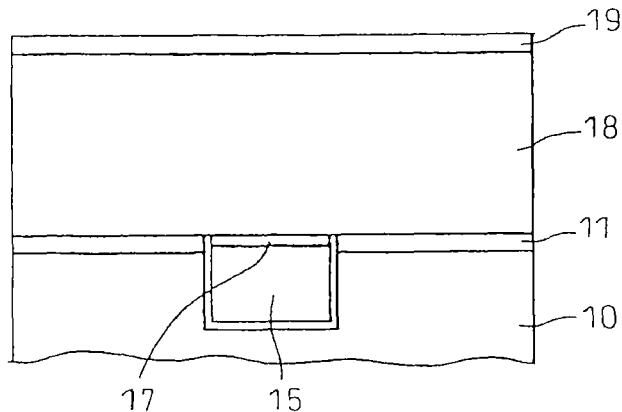
FIGS. 6A to 6C are diagrams showing the method for fabricating the multilevel interconnect structure for the semiconductor integrated circuit according to the second embodiment, in particular, the steps that follow the steps shown in FIG. 5.
Figure 6B:
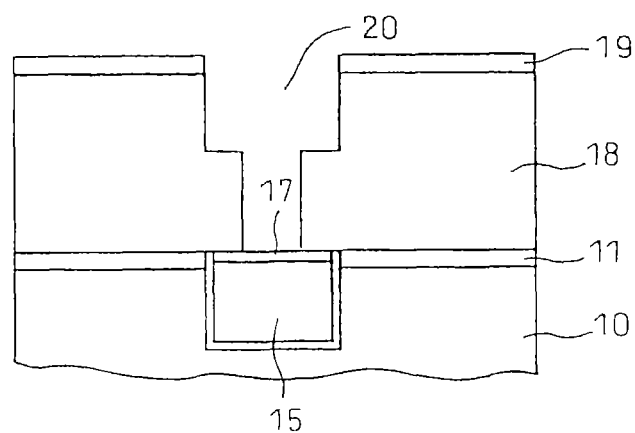
Figure 6C:
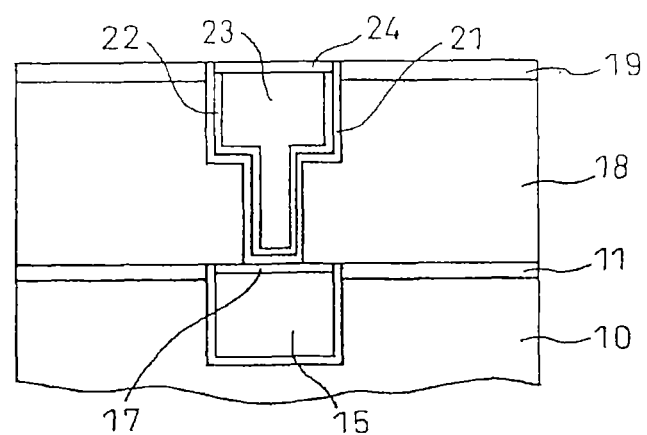

FIGS. 6A to 6C show a process for fabricating a second Cu interconnect layer on top of the sample shown in FIG. 5C. First, as shown in FIG. 6A, a second insulating layer 18 made, for example, of $SiO_2$ or SiOCH and a hard mask 19 are formed, and then, as shown in FIG. 6B, a second interconnect trench 20 is formed by etching by using the hard mask 19 as mask. Next, the second interconnect layer 23 and cap layer 24 are formed in the same manner as the first interconnect layer 15 and cap layer 17 shown in FIGS. 4A to 5C. In FIG. 6C, reference numeral 21 is a barrier layer, and 22 is a seed layer for Cu electrolytic plating.

The Cu multilevel interconnect structure is thus fabricated on the semiconductor wafer by the damascene process. To verify the effect of the Cu multilevel interconnect structure shown in FIGS. 4A to 6C, the present inventors investigated the internal oxidation condition of the Cu by subjecting the sample of FIG. 5C, that is, the sample prepared by forming the Sn oxide ($SnO_{2-x}$) cap layer 17 on the first interconnect layer 15, to heat treatment in air for five minutes at 300° C. As a result, no oxidation of Cu was observed within the interconnect. In this way, according to the present embodiment, the cap layer 17 having excellent reliability is formed selectively only on the Cu surface, and not formed on the insulating layer 10, and thus the dielectric constant of the insulating layer as a whole does not increase.

[Embodiment 3]

Figure 8A:
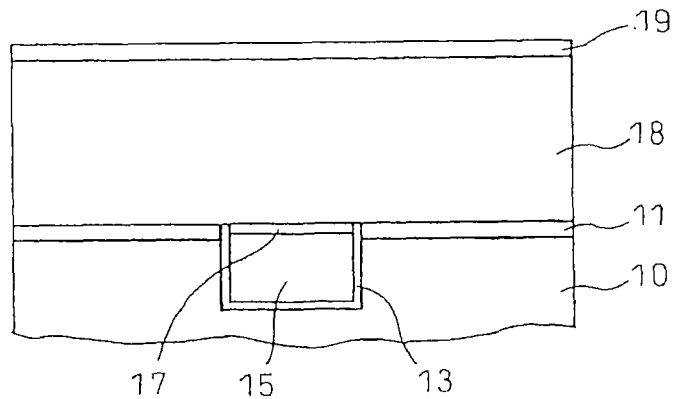
FIGS. 8A to 8C are diagrams showing a method for fabricating a multilevel interconnect structure for a semiconductor integrated circuit according to a third embodiment.
Figure 8B:
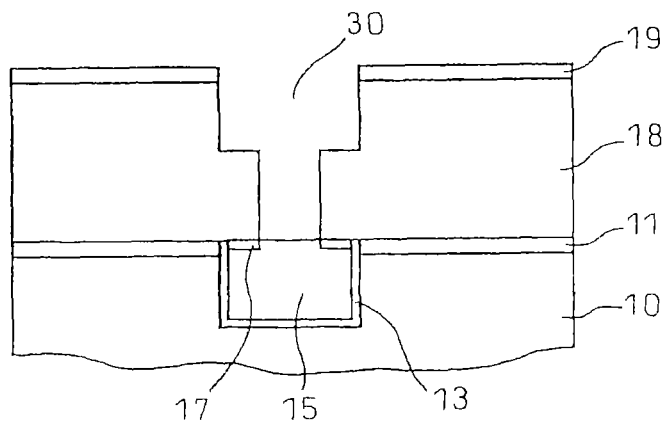
Figure 8C:
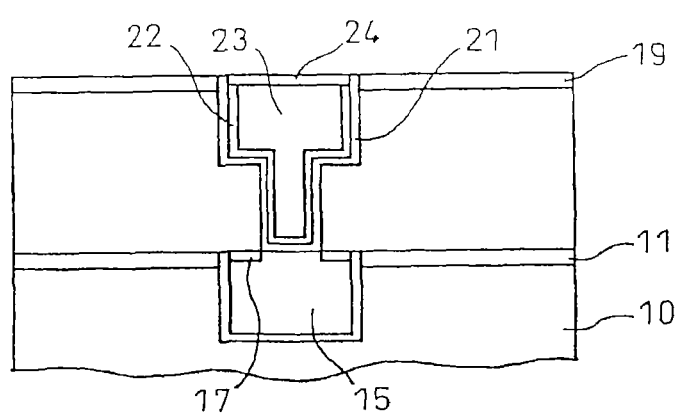

FIGS. 8A to 8C are diagrams showing a method for fabricating a multilevel interconnect structure for a semiconductor integrated circuit according to a third embodiment. The multilevel interconnect structure of this embodiment is characterized in that the first and second Cu interconnect layers are connected without interposing the cap layer therebetween.

The condition shown in FIG. 8A corresponds to the condition shown in FIG. 6A of the second embodiment. The same fabrication steps as those shown in FIGS. 4A to 5C of the second embodiment may be employed for the fabrication of the sample shown in FIG. 8A. When the second insulating layer 18 is formed on the first Cu interconnect layer 15 as shown in FIG. 8A, an interconnect trench 30 is formed within the insulating layer 18 by using the hard mask 19 as an etch mask (see FIG. 8B). At this time, a portion of the cap layer 17 on the first Cu interconnect layer 15 is removed by etching, to expose the surface of the first Cu interconnect layer 15. After that, as shown in FIG. 8C, a barrier layer 21 and a seed layer 22 for electrolytic plating are formed on the inside surface of the trench 30, and Cu is electrolytically plated to form the second Cu interconnect layer 23 by embedding the Cu into the trench 30.

At this time, since a portion of the cap layer 17 on the first Cu interconnect layer 15 has been removed by etching, the barrier layer 21 of Ta or TaN is formed directly on the first Cu interconnect layer 15. The barrier layer 21 of Ta or the like is inherently electrically conductive, and can therefore reduce the connection resistance between the first Cu interconnect layer 15 and the second Cu interconnect layer 23. In the case of the second embodiment, the connection resistance between the first and second Cu interconnect layers 15 and 23 can be reduced by adjusting the oxygen concentration as the cap layer 17 of Sn oxide or Zn oxide becomes a semiconductor or a conductor depending on the oxygen concentration.

[Embodiment 4]

Figure 9A:
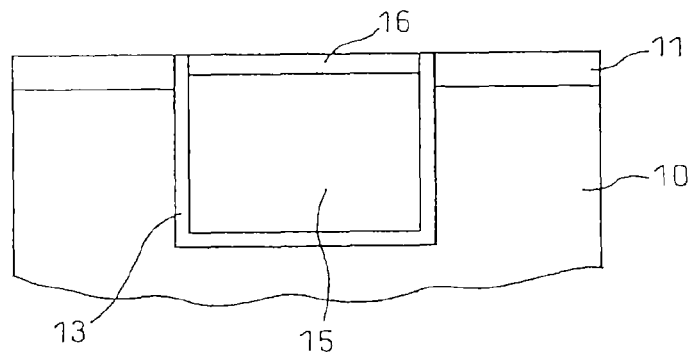
FIGS. 9A to 9C are diagrams showing a method for fabricating a multilevel interconnect structure for a semiconductor integrated circuit according to a fourth embodiment.
Figure 9B:
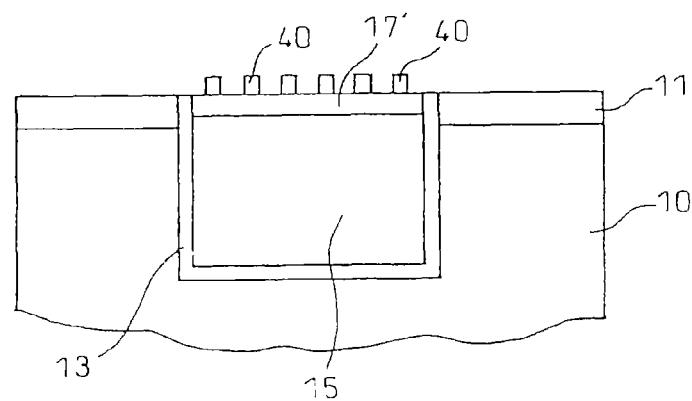
Figure 9C:
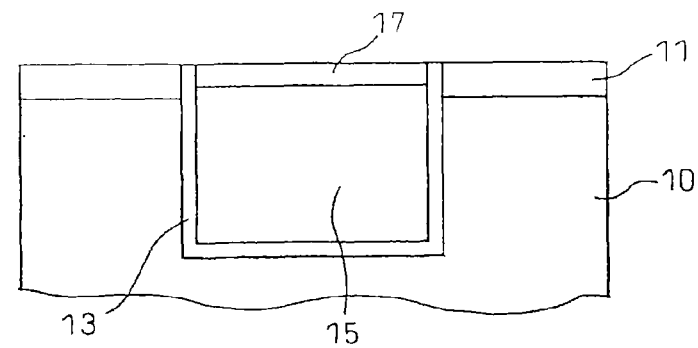

FIG. 9A to 9C are diagrams showing a method for fabricating a multilevel interconnect structure for a semiconductor integrated circuit according to a fourth embodiment. FIG. 9A corresponds to FIG. 5B of the second embodiment, and shows the condition in which the plated layer 16 has been formed by immersion plating of Sn on the first Cu interconnect layer 15 formed in the semiconductor wafer 10. FIG. 9B shows the condition in which the sample of FIG. 9A has been heat-treated (annealed) in an oxidizing atmosphere. Depending on the structure of the plated layer 16 or on the annealing conditions, copper oxide ($CuO_2$) particles 40 may precipitate on the surface of the Sn oxide layer 17' formed after the annealing. In that case, the $CuO_2$ particles 40 precipitated on the surface are removed using a solution such as HF or $H_2O_2$, and thus the cap layer 17 composed principally of Sn oxide is formed (FIG. 9C). After forming the Sn oxide cap layer 17, the multilevel interconnect structure is fabricated in the same manner as the second or third embodiment.

Advantageous Effect of the Invention

According to the present invention, in the fabrication of multilevel interconnects for a semiconductor integrated circuit, a multilevel interconnect structure is provided in which a cap layer of metal oxide, for example, Sn oxide or Zn oxide, is formed at the interface between the Cu interconnect and the insulating layer formed thereon. The Sn oxide or Zn oxide forming the cap layer can be changed from an insulator to a semiconductor and further to a conductor by adjusting the oxygen concentration, and therefore, the presence of such an oxide layer does not contribute to increasing the dielectric constant of the insulating layer. Furthermore, since the Sn oxide or Zn oxide does not transmit oxygen at temperatures lower than 500° C., the oxide layer acts as an oxidation prevention film for the underlying Cu interconnect.

The thickness of the oxide layer is chosen to be within a range of 5 nm to 50 nm. If the thickness is smaller than 5 nm, the oxidation resistance is insufficient, and the oxidation of the underlying Cu interconnect cannot be prevented. On the other hand, if the thickness is greater than 50 nm, since the oxide layer is formed by displacing the Cu interconnect, the Cu content of the interconnect decreases, increasing the effective resistance of the interconnect. By holding the thickness within the range of 5 nm to 50 nm, the interconnect resistance can be maintained within a desirable range without compromising the oxidation resistance.

The Cu interconnect is formed so that the concentration of the metal element, for example, Sn or Zn, solid-solutioned therein does not exceed 2% by atomic fraction. By so doing, the resistance of the Cu interconnect can be prevented from significantly increasing compared with a pure Cu interconnect.

Since the metal oxide layer can be formed selectively on the Cu interconnect layer, such compounds as oxides, carbides, or nitrides, other than the low-dielectric constant insulating layer, can be prevented from residing at the interface between the upper and lower insulating layers, except the area directly above the Cu interconnect layer. This serves to suppress the formation of high-dielectric constant material at the insulating layer interface and thus suppress the increase of the effective dielectric constant of the insulating layer.

When forming multilevel interconnects, chemical-mechanical polishing (CMP) is applied to the Cu interconnect formed within the insulating layer, and after cleaning the surface, Sn or Zn is deposited selectively on the surface of the Cu interconnect by immersion plating. Immersion plating is also known as displacement plating; that is, Cu can easily give electrons to the Sn ions or Zn ions in the plating solution, causing the Sn ions or Zn ions to change to Sn atoms or Zn atoms by which the Cu atoms are substituted. Accordingly, Sn or Zn does not deposit on the surface of the insulating layer that does not easily emit electrons. As a result, Sn or Zn can be deposited selectively only on the Cu surface. Depending on the deposition conditions, the Sn or Zn deposited on the Cu surface may remain thereon as a pure metal or as a solid solution near the Cu surface in the Cu interconnect layer or may form an intermetallic compound with Cu.

The metal, such as Sn or Zn, deposited on the Cu surface by electroless plating, or the solid solution or compound formed with the base Cu, is heated in an oxygen-containing atmosphere, and the deposited metal, for example, Sn or Zn, is selectively oxidized to form an oxide layer on the Cu interconnect surface.

In the step of forming the metal oxide layer by heat-treating the metal layer in an oxidizing atmosphere, if the heat treatment temperature is lower than 150° C., the resulting metal oxide does not have the necessary oxidation resistance, and if the temperature is higher than 450° C., a significant amount of Cu will diffuse outside before the necessary metal oxide can be formed, which is not desirable. Further, at low temperatures, the heat treatment has to be performed for an extended time; here, it is preferable to set the heat treatment time not shorter than 20 minutes but not longer than 60 minutes, but heat treatment time longer than 50 minutes is not desirable because the process time increases. At high temperatures, the heat treatment can be accomplished in a short time, and the metal oxide having the necessary oxidation resistance can be formed by performing the heat treatment for 30 seconds at the minimum.

What is claimed is:

1. A method to fabricate a semiconductor device having a multilevel interconnect structure, comprising:

forming a first insulating layer on a semiconductor wafer;
forming a Cu interconnect layer on a surface of the first insulating layer;
depositing an Sn or Zn layer on the Cu interconnect layer by immersion plating;
forming an Sn or Zn oxide layer by heat-treating the Sn or Zn layer in an oxygen ($O_2$)-containing atmosphere; and
forming a second insulating layer on top of the metal oxide layer and the first insulating layer.

2. The method according to claim 1, wherein the metal oxide layer is formed having a thickness between 5 nm and 50 nm.

3. The method according to claim 1, comprising forming a Cu diffusion prevention film as a barrier layer on the first insulating layer after forming the first insulating layer but before forming the Cu interconnect layer.

4. The method according to claim 1, wherein the heat-treating of the metal layer includes heat-treating the semiconductor wafer, with the metal layer deposited thereon, in the oxygen-containing atmosphere for a period between 30 seconds and 60 minutes at a temperature between 150° C. and 450° C.

5. The method according to claim 1, wherein said Sn oxide is $SnO_{2-x}$ in which x is from 0 to 0.5.

6. A method to fabricate a semiconductor device having a multilevel interconnect structure, comprising:
forming a first insulating layer on a semiconductor wafer;
forming an interconnect trench in the first insulating layer;
embedding a Cu layer into the interconnect trench;
cleaning a surface of the Cu layer by chemical-mechanical polishing;
depositing an Sn or Zn layer on the cleaned surface of the Cu layer by immersion plating;
forming an Sn or Zn oxide layer by heat-treating the Sn or Zn layer in an oxygen ($O_2$)-containing atmosphere; and
forming a second insulating layer on top of the metal oxide layer and the first insulating layer.

7. The method according to claim 6, wherein the metal oxide layer is formed to a thickness between 5 nm and 50 nm.

8. The method according to claim 6, comprising coating an interior surface of the interconnect trench with a Cu diffusion prevention film that acts as a barrier layer, and
wherein the coating takes place between the forming of the interconnect trench and the embedding of the Cu layer.

9. The method according to claim 6, wherein the forming of the metal oxide layer includes heat-treating the semiconductor wafer, with the metal layer deposited thereon, in the oxygen-containing atmosphere for a period between 30 seconds and 60 minutes at a temperature between 150° C. and 450° C.

10. The method according to claim 6, comprising removing copper oxide particles when the copper oxide particles are precipitated on the surface of the metal oxide layer in the forming of the metal oxide layer by heat-treating the metal layer in the oxygen-containing atmosphere.

11. The method according to claim 6, wherein said Sn oxide is $SnO_{2-x}$ in which x is from 0 to 0.5.

* * * * *